(12) United States Patent
Nishida et al.

(10) Patent No.: US 7,365,368 B2
(45) Date of Patent: Apr. 29, 2008

(54) SURFACE-EMITTING TYPE WAFER AND METHOD FOR MANUFACTURING THE SAME, AND BURN-IN METHOD FOR SURFACE-EMITTING TYPE WAFERS

(75) Inventors: Tetsuo Nishida, Suwa (JP); Hajime Onishi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 154 days.

(21) Appl. No.: 11/189,834

(22) Filed: Jul. 27, 2005

(65) Prior Publication Data
US 2006/0022207 A1    Feb. 2, 2006

(30) Foreign Application Priority Data
Jul. 29, 2004   (JP)   .............. 2004-221762
Sep. 21, 2004   (JP)   .............. 2004-273351

(51) Int. Cl.
*H01L 29/205*   (2006.01)
(52) U.S. Cl. .............. 257/91; 257/88; 257/98; 257/79; 257/E25.019; 257/E27.119; 372/43; 372/75; 250/552; 438/22
(58) Field of Classification Search .............. None
See application file for complete search history.

(56) References Cited
U.S. PATENT DOCUMENTS
5,568,498 A * 10/1996 Nilsson .............. 372/43.01
5,821,566 A * 10/1998 Kang .............. 257/80
2007/0081568 A1 * 4/2007 Imai .............. 372/38.09

FOREIGN PATENT DOCUMENTS
JP    A-2001-024270    1/2001

OTHER PUBLICATIONS
Kenji Kitagawa, "Service Life Test Technology", Colona Publishing Co., 1986, pp. 176-183, see p. 182, lines 8-11 (with an English-language translation of a relevant portion).

* cited by examiner

*Primary Examiner*—Evan Pert
*Assistant Examiner*—Scott R. Wilson
(74) *Attorney, Agent, or Firm*—Oliff & Berridge, PLC

(57) ABSTRACT

To simplify the burn-in process and reduce its cost for a surface-emitting type wafer and its manufacturing method, and for a burn-in method for a surface-emitting type wafer. A surface-emitting type wafer includes a substrate 10 and a plurality of surface-emitting type elements 1 formed above the substrate 10. Each of the surface-emitting type elements 1 includes a light emitting element section 20, first and second electrodes 30, 32 for driving the light emitting element section 20, and a rectification element section 40. The rectification element section 40 is connected in parallel between the first and second electrodes 30, 32, and has a rectification action in a reverse direction with respect to the light emitting element section 20. The plurality of surface-emitting type elements 1 are connected in series in a direction in which forward directions of the respective light emitting element sections 20 coincide with one another.

12 Claims, 7 Drawing Sheets (A)

(B)

SURFACE-EMITTING TYPE WAFER AND METHOD FOR MANUFACTURING THE SAME, AND BURN-IN METHOD FOR SURFACE-EMITTING TYPE WAFERS

This application claims the benefit of Japanese Patent Application No. 2004-221762 filed Jul. 29, 2004 and Japanese Patent Application No. 2004-273351 filed Sep. 21, 2004. The entire disclosure of the prior applications are hereby incorporated by reference herein their entirety.

BACKGROUND

The present invention relates to surface-emitting type devices and methods for manufacturing the same, and burn-in methods for surface-emitting type wafers.

Surface-emitting type elements such as surface-emitting type semiconductor lasers may change their initial characteristics when a current is injected after their completion, and therefore a so-called burn-in process is performed, in which a current is injected for a predetermined period of time in a high temperature condition during the manufacturing process to stabilize the characteristics. (see Non-Patent Document 1) Also, because surface-emitting type elements emit light orthogonally to a substrate surface, they can be subjected to a burn-in process in the state of a wafer.

However, in the state of a wafer that has 1000-10000 elements, in order to perform a burn-in process for all of the elements, a current source of 10 A-100 A is required, assuming that a drive current for each of the elements is 10 mA. Furthermore, in order to circulate a current in series in each of the elements, probes are required in a number that equals to at least the number of the elements or greater. Accordingly, there is a problem in that not only the burn-in process is time-consuming, but also the cost increases.

[Non-patent Document 1] *Service Life Test Technology*, Colona Publishing Co., 1986, page 176-183, by Kenji Kitagawa

SUMMARY

It is an object of the present invention to simplify the burn-in process and reduce its cost for a surface-emitting type wafer and its manufacturing method, and for a method to burn-in a surface-emitting type wafer.

(1) A surface-emitting type wafer in accordance with the present invention pertains to a surface-emitting type wafer comprising a substrate and a plurality of surface-emitting type elements formed above the substrate, wherein each of the surface-emitting type elements includes a light emitting element section, first and second electrodes for driving the light emitting element section, and a rectification element section, the rectification element section is connected in parallel between the first and second electrodes, and has a rectification action in a reverse direction with respect to the light emitting element section, and the plurality of surface-emitting type elements may be connected in series in a direction in which forward directions of the respective light emitting element sections coincide with one another.

According to the present invention, when performing a burn-in process in which a predetermined current is injected in a plurality of surface-emitting type elements to drive them, and if any of the light emitting element sections becomes electrically disconnected by deterioration or the like, the current circulates through the rectification element section that is connected in parallel with the light emitting element section, and the current always circulates in the other light emitting element sections connected in series, and they are thus placed in a state being driven. In other words, even when a failure occurs in any of the plurality of light emitting element sections, a predetermined current can be kept injected in a batch in a group of surface-emitting type elements that are electrically connected to one another. Also, a probe for a power supply needs only to be prepared for each group of surface-emitting type elements that are electrically connected, such that simplification of the burn-in process and substantial reduction in the cost can be achieved.

It is noted that, in the present invention, the case where a layer B is provided above a specific layer A includes a case where the layer B is directly provided on the layer A, and a case where the layer B is provided over the layer A through another layer. This similarly applies to the following inventions.

(2) In the surface-emitting type wafer,
   the light emitting element section may include, above the substrate, a first semiconductor section of a first conductivity type, a second semiconductor section that functions as an active layer, and a third semiconductor section of a second conductivity type, which are arranged from a side of the substrate, and
   the rectification element section may include, above the substrate, a first supporting section consisting of an identical composition of the first semiconductor section, a second supporting section consisting of an identical composition of the second semiconductor section, a fourth semiconductor section, and a fifth semiconductor section, which are arranged from the side of the substrate.

(3) In the surface-emitting type wafer,
   the fourth semiconductor section may be formed in the second conductivity type, and
   the fifth semiconductor section may be formed in the first conductivity type.

(4) In the surface-emitting type wafer,
   the fourth semiconductor section may be formed with a composition identical with the third semiconductor section.

(5) In the surface-emitting type wafer, a capacitance reducing section may be provided between the fourth and fifth semiconductor sections.

(6) In the surface-emitting type wafer,
   the capacitance reducing section may be composed of an intrinsic semiconductor.

(7) In the surface-emitting type wafer,
   the capacitance reducing section may be composed of a semiconductor having an impurity concentration lower than the fourth or fifth semiconductor section.

(8) In the surface-emitting type wafer,
   the fourth semiconductor section may include a GaAs layer at an uppermost surface, and the capacitance reducing section may include an AlGaAs layer.

(9) In the surface-emitting type wafer, a Schottky junction may be formed in one of the fourth and fifth semiconductor sections.

(10) In the surface-emitting type wafer,
   the third semiconductor section may include at least two layers of different compositions,
   the fourth semiconductor section may include a composition identical with at least one of the two layers of different compositions, and the fifth semiconductor section may include a composition identical with at least the other of the two layers of different compositions.

(11) In the surface-emitting type wafer, the light emitting element section may function as a surface-emitting type semiconductor laser, the first semiconductor section may function as a first mirror, and the third semiconductor section may function as a second mirror.

(12) In the surface-emitting type wafer, the third semiconductor section may include at least two layers of AlGaAs layers of different Al compositions, the fifth semiconductor section may include an AlGaAs layer with an Al composition higher than the fourth semiconductor section, and a Schottky junction may be formed in the fifth semiconductor section.

(13) A burn-in method using the surface-emitting type wafer in accordance with the present invention pertains to a burn-in method using the surface-emitting type wafer described above, and includes the step of:

circulating a current of a predetermined current value to the plurality of surface-emitting type elements connected in series in a forward direction of the light emitting element sections, wherein the predetermined current value is greater than a current value corresponding to a breakdown voltage of the rectification element section.

According to the present invention, even when any of the light emitting element sections becomes electrically disconnected by deterioration or the like, the current circulates through the rectification element section that is connected in parallel with the light emitting element section, and the current always circulates in the other light emitting element sections connected in series, and they are thus placed in a state being driven. In other words, even when a failure occurs in any of the plurality of light emitting element sections, a predetermined current can be kept circulating in a group of surface-emitting type elements together which are electrically connected to one another. Also, a probe for a power supply needs only to be prepared for each group of surface-emitting type elements that are electrically connected, such that simplification of the burn-in process and substantial reduction in the cost can be achieved.

(14) A method for manufacturing a surface-emitting type wafer in accordance with the present invention includes the step of:

forming, above a substrate, a plurality of surface-emitting type elements, each including a light emitting element section, first and second electrodes for driving the light emitting element section, and a rectification element section, wherein, in the step of forming each of the surface-emitting type elements, the rectification element section is connected in parallel between the first and second electrodes to have a rectification action in a reverse direction with respect to the light emitting element section, and after the step of forming each of the surface-emitting type elements, the plurality of surface-emitting type elements are connected in series in a direction in which forward directions of the respective light emitting element sections coincide with one another.

By a surface-emitting type wafer manufactured in accordance with the present invention, when a burn-in process is conducted in which a predetermined current is injected in a plurality of surface-emitting type elements to drive them, and if any of the light emitting element sections becomes electrically disconnected by deterioration or the like, the current circulates through the rectification element section that is connected in parallel with the light emitting element section, and the current always circulates in the other light emitting element sections connected in series, and they are thus placed in a state being driven. In other words, even when a failure occurs in any of the plurality of light emitting element sections, a predetermined current can be kept circulating in a group of surface-emitting type elements together which are electrically connected to one another. Also, a probe for a power supply needs only to be prepared for each group of surface-emitting type elements that are electrically connected, such that simplification of the burn-in process and substantial reduction in the cost can be achieved.

(15) In the method for manufacturing a surface-emitting type wafer, the step of forming each of the surface-emitting type elements may include the steps of:

(a) forming, above the substrate, a first semiconductor layer of a first conductivity type, a second semiconductor layer that functions as an active layer, a third semiconductor layer of a second conductivity type, and a fourth semiconductor layer of the first conductivity type;

(b) etching at least the third and fourth semiconductor layers to form a light emitting element section including a first semiconductor section of the first conductivity type, a second semiconductor section that functions as the active layer, and a third semiconductor section of the second conductivity type, which are disposed above the substrate from a side of the substrate, and a rectification element section including a first supporting section consisting of an identical composition of the first semiconductor section, a second supporting section consisting of an identical composition of the second semiconductor section, a fourth semiconductor section of the second conductivity type, and a fifth semiconductor section of the first conductivity type, which are disposed above the substrate from the side of the substrate;

(c) forming first and second electrodes; and (d) connecting the fourth and fifth semiconductor sections in parallel between the first and second electrodes to have a rectification action in a reverse direction with respect to the light emitting element section.

(16) In the method for manufacturing a surface-emitting type wafer, the step (a) may further include forming a capacitance reducing layer between the third and fourth semiconductor layers, and the step (b) may further include patterning the capacitance reducing layer to form a capacitance reducing section between the fourth and fifth semiconductor sections.

(17) In the method for manufacturing a surface-emitting type wafer, the third semiconductor layer may include a GaAs layer at an uppermost surface, the capacitance reducing layer may include an AlGaAs layer, and the capacitance reducing layer may be patterned by wet-etching in the step (b).

(18) In the method for manufacturing a surface-emitting type wafer, the step of forming each of the surface-emitting type elements may include the steps of:

(a) forming, above the substrate, a first semiconductor layer of a first conductivity type, a second semiconductor layer that functions as an active layer, and a third semiconductor layer of a second conductivity type;

(b) etching at least the third semiconductor layer to form a light emitting element section including a first semiconductor section of the first conductivity type, a second semiconductor section that functions as the active layer, and a third semiconductor section of the second conductivity type, which are disposed above the substrate from a side of the substrate, and a rectification element section including a first supporting section consisting of an identical composition of the first semiconductor section, a second supporting section consisting of an identical composition of the second semiconductor section, a fourth semiconductor section of the second conductivity type, and a fifth semiconductor section of the second conductivity type, which are disposed above the substrate from the side of the substrate;

(c) forming first and second electrodes;

(d) forming a Schottky junction in one of the fourth and fifth semiconductor sections; and (e) connecting the fourth and fifth semiconductor sections in parallel between the first and second electrodes to have a rectification action in a reverse direction with respect to the light emitting element section.

DETAILED DESCRIPTION OF EMBODIMENTS

Embodiments of the present invention are described below with reference to the accompanying drawings.

1-1. Surface-Emitting Type Device

Figure 1:
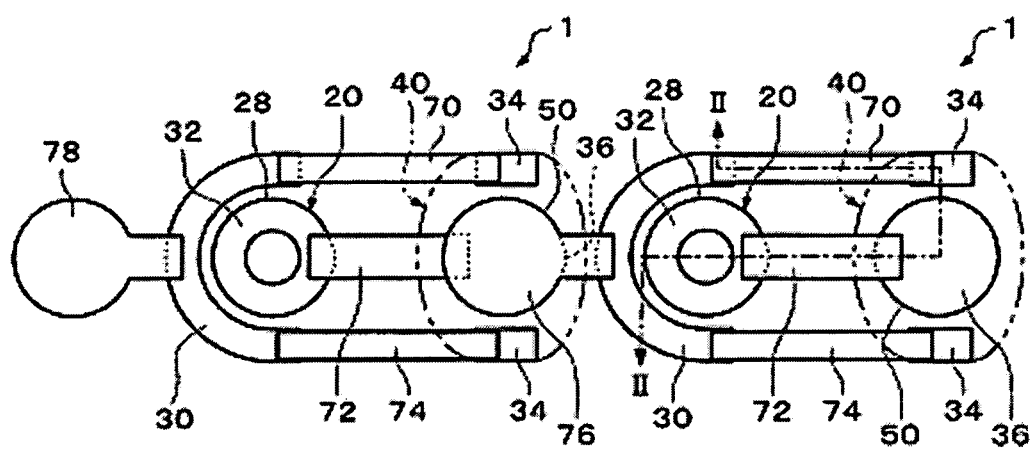
FIG. 1(A) is a partially enlarged view of a surface-emitting type wafer in accordance with a first embodiment of the present invention.
FIG. 1(B) is an overall plan view of the surface-emitting type wafer in accordance with a first embodiment of the present invention.
Figure 1:
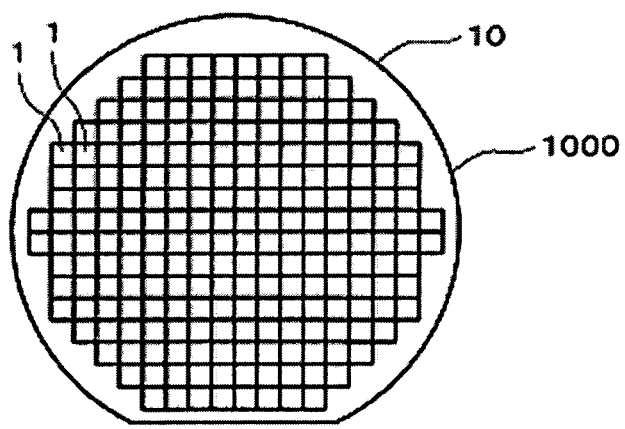
Figure 2:
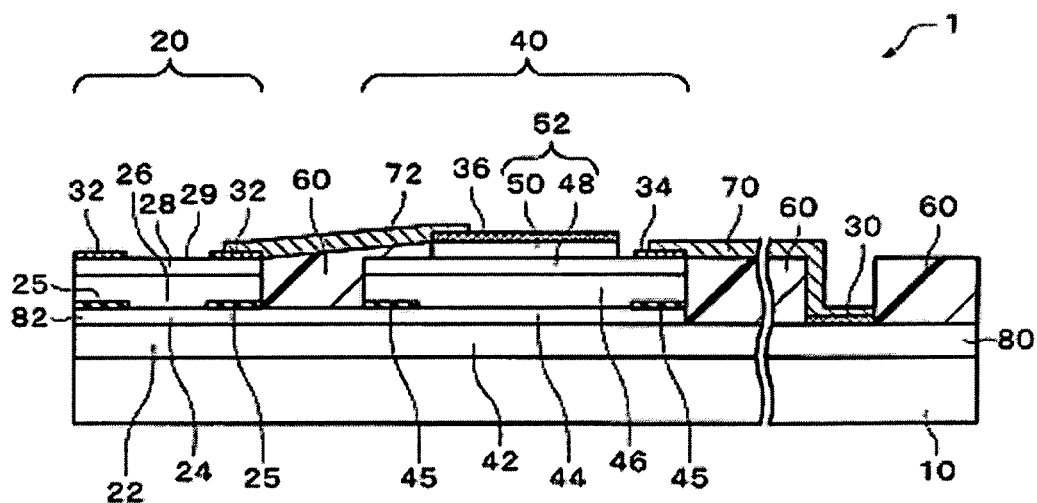
FIG. 2 is a cross-sectional view taken along a line II-II of FIG. 1(A).
Figure 3:
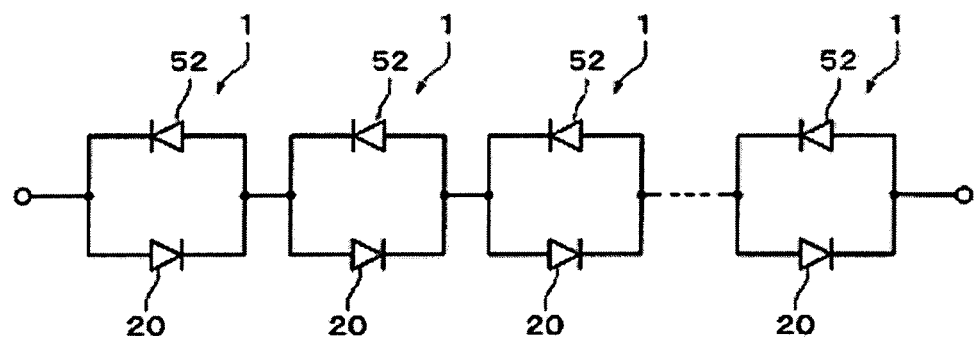
FIG. 3 is a circuit diagram of the surface-emitting type wafer in accordance with the first embodiment of the present invention.

FIG. 1(A) is a partially enlarged view of a surface-emitting type wafer in accordance with a first embodiment of the present invention. FIG. 1(B) is an overall plan view of the surface-emitting type wafer in accordance with the present embodiment. FIG. 2 is a cross-sectional view taken along a line II-II of FIG. 1(A). FIG. 3 is a circuit diagram of the surface-emitting type wafer in accordance with the present embodiment.

A surface-emitting type wafer 1000 includes a substrate 10 and a plurality of surface-emitting type elements 1. The plurality of surface-emitting type elements 1 are formed on the substrate 10. The substrate 10 is a semiconductor substrate (for example, an n-type GaAs substrate), and supports the plurality of surface-emitting type elements 1. After a burn-in process to be described below is completed, the surface-emitting type elements 1 are cut into individual pieces and become surface-emitting type chips.

First, each of the surface-emitting type elements 1 is described. In the present embodiment, a case in which the surface-emitting type element is a surface-emitting type semiconductor laser is described as an example.

The surface-emitting type element 1 includes a light emitting element section 20 and a rectification element section 40. The light emitting section 20 and the rectification element section 40 are implemented in a single surface-emitting type chip, and formed in a monolithic structure.

An upper surface of the light emitting element section 20 defines a light emission surface 29. The light emitting element section 20 has a plane configuration that is a circular shape, but is not limited to this shape. In the case of a surface-emitting type semiconductor laser, the light emitting element section 20 is called a vertical resonator.

The light emitting element section 20 includes a first semiconductor section 22 of a first conductivity type (for example, n-type), a second semiconductor section 24 that functions as an active layer, and third semiconductor sections 26 and 28 of a second conductivity type (for example, p-type), which are arranged from the side of the substrate 10.

The first semiconductor section 22 may be, for example, a distributed reflection type multilayer mirror of 40 pairs of alternately laminated n-type $Al_{0.9}Ga_{0.1}As$ layers and n-type $Al_{0.15}Ga_{0.85}As$ layers (first mirror). The second semiconductor section 24 may be composed of, for example, GaAs well layers and $Al_{0.3}Ga_{0.7}As$ barrier layers in which the well layers include a quantum well structure composed of three layers. The third semiconductor section 26 may be, for example, a distributed reflection type multilayer mirror of 25 pairs of alternately laminated p-type $Al_{0.9}Ga_{0.1}As$ layers and p-type $Al_{0.15}Ga_{0.85}As$ layers (second mirror). Also, the third semiconductor section 28 at the uppermost surface may be a contact section composed of, for example, p-type GaAs layers. It is noted that the composition of each of the layers and the number of the layers forming the first semiconductor section 22, the second semiconductor section 24, and the third semiconductor sections 26 and 28 are not limited to the above.

The third semiconductor sections 26 and 28 are made to be p-type by doping C, Zn, Mg or the like, and the first semiconductor section 22 is made to be n-type by doping Si, Se or the like. Accordingly, the third semiconductor sections 26 and 28, the second semiconductor section 24 in which no impurity is doped, and the first semiconductor section 22 form a pin diode.

A dielectric layer 25 is formed in a region near the second semiconductor section 24 that functions as an active layer among the layers composing the third semiconductor section 26. The dielectric layer 25 functions as a current constricting layer. The dielectric layer 25 may be formed, for example, in a ring shape along the circumference of the plane configuration of the light emitting element section 20. The dielectric layer 25 can be formed from aluminum oxide as a main component.

At the light emitting element section 20, first and second electrodes 30 and 32 for driving are formed.

The first electrode 30 is electrically connected to the first semiconductor section 22, and may be formed, for example, on a portion that is continuous with the first semiconductor section 22 (on a first semiconductor layer 80 shown in FIG. 2). As shown in FIG. 1, the first electrode 30 is formed outside the third semiconductor section 28, and extends in a manner, for example, to encircle a half of the outer circumference of the third semiconductor section 28. The first electrode 30 can be formed from a multilayer film of, for example, Au and an alloy of Au and Ge.

The second electrode 32 is electrically connected to the third semiconductor sections 26 and 28, and may be formed, for example, on the third semiconductor section 28 that is a contact section. As shown in FIG. 1, the second electrode 32 may be formed in a ring shape along an edge section of the upper surface of the third semiconductor section 28. In this case, a center section of the upper surface of the third semiconductor section 28 defines an emission surface 29. The second electrode 32 can be formed from a multilayer film of, for example, Au and an alloy of Au and Zn.

A current can be injected to the second semiconductor section 24 that functions as an active layer by the first and second electrodes 30 and 32. It is noted that the materials of the first and second electrodes 30 and 32 are not limited to the above, and metals, such as, for example, Ti, Ni, Au or Pt, or an alloy of these metals can be used.

The rectification element section 40 is formed on a region different from the light emitting element section 20 in the surface-emitting type element 1. At least a part of the rectification element section 40 has a rectification action. The rectification element section 40 of the present embodiment includes a junction diode 52.

The rectification element section 40 includes a first supporting section 42 composed of the same composition as that of the first semiconductor section 22, a second supporting section 44 composed of the same composition as that of the second semiconductor section 24, fourth semiconductor sections 46 and 48, and a fifth semiconductor section 50, which are arranged from the side of the substrate 10.

The first supporting section 42 may be formed continuously with the first semiconductor section 22. In other words, the first semiconductor layer 80 is formed on the substrate 10, a part of the first semiconductor layer 80 may define the first semiconductor section 22, and another part thereof may define the first supporting section 42. Also, the second supporting section 44 may be formed continuously with the second semiconductor section 24. In other words, a second semiconductor layer 82 is formed on the first semiconductor layer 80, a part of the second semiconductor layer 82 may define the second semiconductor section 24, and another part thereof may define the second supporting section 44. Alternatively, the second supporting section 44 may be separated from the second semiconductor section 24.

The fourth semiconductor sections 46 and 48 are formed in a second conductivity type (for example, p-type), and the fifth semiconductor section 50 is formed in a first conductivity type (for example, n-type). By this, a pn junction diode can be formed at an interface between the fourth and fifth semiconductor sections 48 and 50. It is noted that not only the fourth semiconductor section 48 but also the fourth semiconductor section 46 may contribute to operations of the pn junction diode.

The fourth semiconductor sections 46 and 48 may be formed in the same composition as that of the third semiconductor sections 26 and 28. In the example shown in FIG. 2, the fourth semiconductor section 46 is formed in the same composition as that of the third semiconductor section 26 that is a mirror, and the fourth semiconductor section 48 is formed in the same composition as that of the third semiconductor section 28 that is a contact section. It is noted that a dielectric layer 45 may be formed in a region near the second supporting section 44 among the layers composing the fourth semiconductor section 46. The dielectric layer 45 may be formed in the same process for forming the dielectric layer 25 that functions as the current constriction layer.

The fifth semiconductor section 50 may be formed from, for example, an n-type GaAs layer. In the present embodiment, the fifth semiconductor section 50 is not limited to any specific material as long as it has a conductivity type different from that of the fourth semiconductor sections 48 and 48. For example, the fifth semiconductor section 50 may have a conductivity type different from that of the fourth semiconductor sections 46 and 48, and may be formed with the same composition as that of at least a part of the fourth semiconductor sections 46 and 48 (for example, the fourth semiconductor section 48).

At the rectification element section 40, third and fourth electrodes 34 and 36 for driving are formed.

The third electrodes 34 are electrically connected to the fourth semiconductor sections 46 and 48. For example, the fifth semiconductor section 50 may be formed on a part of the fourth semiconductor section 48, and the third electrodes 34 may be formed in an exposed region of the fourth semiconductor section 48. The third electrodes 34 may be formed in the same composition as that of the second electrode 32 that corresponds to the same conductivity type (the second conductivity type (for example, p-type)).

On the other hand, the fourth electrode 36 is electrically connected to the fifth semiconductor section 50, and may be formed, for example, on an upper surface of the fifth semiconductor section 50. Because light is not emitted from the upper surface of the fifth semiconductor section 50, the entire upper surface of the fifth semiconductor section 50 may be covered by the fourth electrode 36. The fourth electrode 36 may be formed in the same composition as that of the first electrode 30 that corresponds to the same conductivity type (the first conductivity type (for example, n-type)).

The rectification element section 40 is connected in parallel between the first and second electrodes 30 and 32, and has a rectification action in a reverse direction with respect to the light emitting section 20. In the present embodiment, the fourth and fifth semiconductor sections 48 and 50 of the rectification element section 40 form a junction diode 52, and the junction diode 52 is connected in parallel between the first and second electrodes 30 and 32. More specifically, the third electrode 34 on the fourth semiconductor section 48 and the first electrode 30 are electrically connected by a wiring 70, and the fourth electrode 36 on the fifth semiconductor section 50 and the second electrode 32 are electrically connected by a wiring 72.

When the light emitting element section 20 is driven, a voltage in forward bias is impressed to the light emitting element section 20. In this case, because a current is flown only to the light emitting element section 20, the breakdown voltage of the junction diode 52 is preferably greater than the drive voltage of the light emitting element section 20. By so doing, even when a voltage in forward bias is impressed at the time of driving the light emitting element section 20, no (or almost no) reverse current flows in the fourth and fifth semiconductor sections 48 and 50 (junction diode 52), such that the light emitting element section 20 normally performs a light emission operation. Or, in a burn-in process to be described below, a constant current can be flown in normal light emitting element sections 20.

It is noted here that the breakdown voltage value of the junction diode 52 can be suitably controlled by adjusting compositions and/or impurity concentrations of the fourth and fifth semiconductor sections 48 and 50. For example, the breakdown voltage of the junction diode 52 can be made greater by reducing the impurity concentration of the fourth and fifth semiconductor sections 48 and 50. In the case of the present embodiment, the fourth and fifth semiconductor sections 48 and 50 are formed independently of the semiconductor sections that contribute to the light emission operation of the light emitting element section 20, respectively. In particular, because the fifth semiconductor section 50 can be formed without depending on the structure of the light emitting element section 20, its composition and impurity concentration can be freely adjusted.

Alternatively, by adjusting compositions and/or impurity concentrations of the first and third semiconductor sections 22, and 26 and 28 of the light emitting element section 20, respectively, the drive voltage value of the light emitting element section 20 may be made smaller than the breakdown voltage value of the junction diode 52.

As shown in FIG. 1, the first electrode 30 is formed in a U-shape in a manner to encircle the outer circumference of the second electrode 32, and the third electrodes 34 are formed in positions opposing to end sections of the first electrode 30, respectively. Then, one of the end sections of the first electrode 30 and one of the third electrodes 34 are electrically connected by a wiring 70, and the other of the end sections of the first electrode 30 and the other of the third electrodes 34 are electrically connected by a wiring 74. Also, the second and fourth electrodes 32 and 36 are electrically connected by a wiring 72 in a region surrounded by the first and third electrodes 30 and 34, and the wirings 70 and 74. It is noted that the wirings 70, 72 and 74 are formed on a resin layer (for example, a polyimide resin layer) 60 (see FIG. 2).

As shown in FIG. 1 and FIG. 3, a plurality of surface-emitting type elements 1 are connected in series in a direction in which forward directions of their respective light emitting element sections 20 coincide with one another. All of the plurality of surface-emitting type elements 1 that are formed in one surface-emitting type wafer 1000 may be electrically connected, or a part of them may be electrically connected. In the example shown in FIG. 1, in adjacent ones of the surface-emitting type elements 1, the first electrode 30 of one of the surface-emitting type elements 1 and the fourth electrode 36 of the other of the surface-emitting type elements 1 are electrically connected by a wiring 76. It is noted that the wiring 76 is electrically cut at the time of cutting into individual pieces to be conducted after completion of a burn-in process.

Driving of the surface-emitting type elements after cutting them into individual pieces is described. In the light emitting element section 20, when applying a voltage in a forward direction to the pin diode between the first and second electrodes 30 and 32, the second semiconductor section 24 functions as an active layer, and recombinations of electrons and holes occur, thereby causing emission of light due to the recombinations. Stimulated emission occurs during the period the generated light reciprocates between the first semiconductor section 22 and the third semiconductor section 26, whereby the light intensity is amplified. When the optical gain exceeds the optical loss, laser oscillation occurs, and laser light is emitted from the light emission surface 29 in a direction orthogonal to the substrate 10.

In accordance with the present embodiment, when performing a burn-in process in which a predetermined current is injected in a plurality of surface-emitting type elements 1 to drive them, and if any of the light emitting element sections 20 becomes electrically disconnected by deterioration or the like, the current circulates through the rectification element section 40 (more specifically, the junction diode 52) that is connected in parallel with the light emitting element section 20, and the current always circulates in the other light emitting element sections 20 connected in series, and they are thus placed in a state being driven (see FIG. 3). In other words, even when a failure occurs in any of the plurality of light emitting element sections 20, a predetermined current can be kept injected in a batch in a group of surface-emitting type elements 1 that are electrically connected to one another. Also, a probe for a power supply needs only to be prepared for each group of surface-emitting type elements that are electrically connected, such that simplification of the burn-in process and substantial reduction in the cost can be achieved.

It is noted that the present invention is not limited to surface-emitting type semiconductor lasers, but is also applicable to other surface-emitting type elements (for example, semiconductor light emission diodes, organic LEDs, etc.). Also, the p-type and n-type of each of the semiconductors described above may be interchanged. Moreover, in the examples described above, the description is made as to an AlGaAs type, but depending on the oscillation wavelength to be generated, other materials, such as, for example, GaInP type, ZnSSe type, InGaN type, AlGaN type, InGaAs type, GaInNAs type, GaAsSb type, and like semiconductor materials can be used.

Also, the rectification element section 40 is not limited to the structure described above, as long as at least a part thereof has a rectification action. For example, a zener diode may be applied, or a Schottky diode (see a second embodiment for its details) may be applied, or a switching element (for example, a thyristor) that can be turned on and off by application of a voltage may be applied.

1-2. Burn-in Method for Surface-emitting Type Wafer

The burn-in method for a surface-emitting type wafer in accordance with the present embodiment includes circulating a current of a predetermined current value in a group of surface-emitting type elements 1 that are electrically connected in a forward direction of the light emitting sections 20.

Specifically, probes (not shown) are used, to supply a current of a power supply (current source) to a group of surface-emitting type elements 1 that are electrically connected. A first probe is brought in contact with an electrical connection section (an electrical connection section 76 in FIG. 1) of one of the surface-emitting type elements 1, and a second probe is brought in contact with an electrical connection section (an electrical connection section 78 that also serves as the fourth electrode 36 in FIG. 1) of another one of the surface-emitting type elements 1. By this, the probes of the power supply need to be prepared for each group of the surface-emitting type elements 1 that are electrically connected, and therefore the number of probes can be substantially reduced, the burn-in process can be simplified, and the cost can be substantially reduced, compared to the conventional case where two of them are prepared for each surface-emitting type element 1.

Conditions (temperature environment, current value and time) of the burn-in process may be set according to the requirements. For example, each of the surface-emitting type elements 1 may be driven, in a temperature environment of 100° C.-150° C., by continuously supplying a current of about 10 mA-20 mA for about 10 hours-20 hours. By this, compared to the prior art, a power supply with a small current value and a large voltage value can be prepared.

It is noted here that the predetermined current value in the burn-in process is greater than a current value corresponding to the breakdown voltage of the rectification element section 40 (the junction diode 52 in the present embodiment). In this case, the predetermined current value at the time of the burn-in process may be adjusted to become greater, or the current value corresponding to the breakdown voltage of the junction diode 52 may be adjusted to become smaller in the manufacturing of the surface-emitting type wafer. By so doing, if any of the light emitting element sections 20 becomes electrically disconnected by deterioration or the like, the current circulates through the rectification element section 40 (more specifically, the junction diode 52) that is connected in parallel with the light emitting element section 20, such that the current always circulates in the other light emitting element sections 20 connected in series, and they are thus placed in a state being driven. In other words, even when a failure occurs in any of the plurality of light emitting element sections 20, a predetermined current can be kept injected in a batch in a group of surface-emitting type elements 1 that are electrically connected to one another.

It is noted that the range of the predetermined current values in the burn-in process may include the range of drive current values at the time of use of the surface-emitting type element 1 that is to be actually used.

1-3. Method of Manufacturing Surface-Emitting Type Wafer

FIGS. 4-8 are figures showing a method for manufacturing a surface-emitting type wafer in accordance with the first embodiment of the present invention. The method for manufacturing a surface-emitting type wafer includes manufacturing a plurality of surface-emitting type elements 1 described above on a substrate 10.

Figure 4:
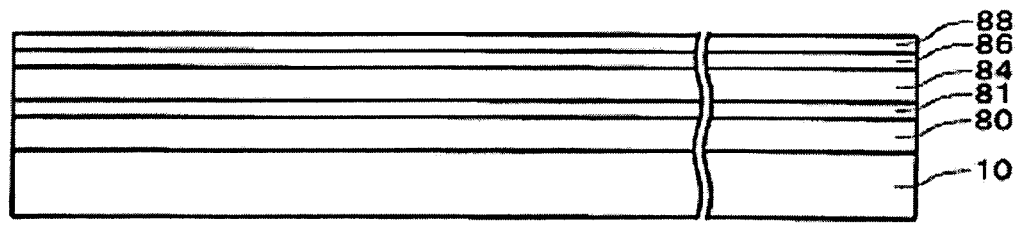
FIG. 4 is a view showing a method for manufacturing the surface-emitting type wafer in accordance with the first embodiment of the present invention.

As shown in FIG. 4, on a substrate 10, a first semiconductor layer 80 of a first conductivity type (for example, n-type), a second semiconductor layer 81 that functions as an active layer, third semiconductor layers 84 and 86 of a second conductivity type (for example, p-type), and a fourth semiconductor layer 88 of the first conductivity type (for example, n-type) are formed by epitaxial growth while varying the composition. The compositions of the first through third semiconductor layers 80, 81, 84 and 86 correspond to the details of the first through third semiconductor sections 22, 24, 26 and 28 described above, respectively, and the composition of the fourth semiconductor layer 88 corresponds to the details of the fifth semiconductor section 50 described above.

It is noted that, when growing the third semiconductor layer 84, at least one layer adjacent to the second semiconductor layer 81 that functions as an active layer is formed as an AlAs layer or an AlGaAs layer having Al composition being 0.95 or greater. This layer is later oxidized, and becomes a dielectric layer 25 that functions as a current constricting layer (see FIG. 8). Also, by forming the third semiconductor layer 86 at the uppermost surface to have a function as a contact section, ohmic contact between the second electrode 32 and the third electrode 34 can be readily formed.

The temperature at which the epitaxial growth is conducted is appropriately decided depending on the growth method, the kind of raw material, the type of the semiconductor substrate 10, and the kind, thickness and carrier density of each of the semiconductor layers to be formed, and in general may preferably be 450° C.-800° C. Also, the time required when the epitaxial growth is conducted is appropriately decided just like the temperature. Also, a metal-organic vapor phase deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 5:
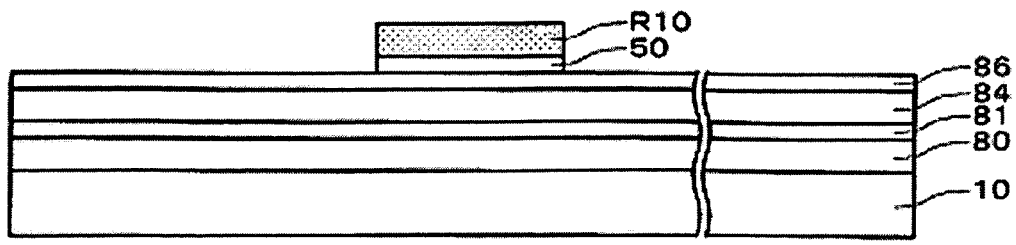
FIG. 5 is a view showing the method for manufacturing the surface-emitting type wafer in accordance with the first embodiment of the present invention.
Figure 6:
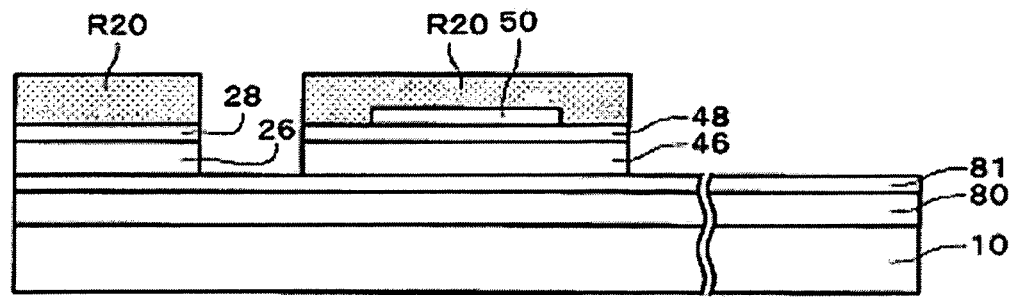
FIG. 6 is a view showing the method for manufacturing the surface-emitting type wafer in accordance with the first embodiment of the present invention.
Figure 7:
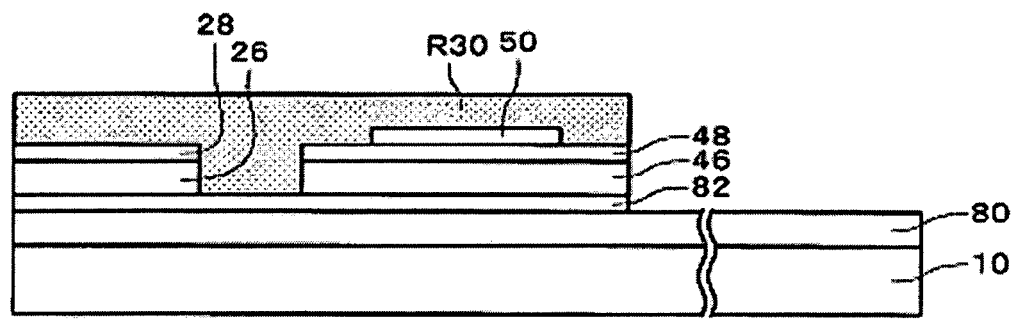
FIG. 7 is a view showing the method for manufacturing the surface-emitting type wafer in accordance with the first embodiment of the present invention.

Next, as shown in FIG. 5-FIG. 7, at least the third and the fourth semiconductor layers 84 and 86, and 88 are patterned to form a light emitting element section 20 and a rectification element section 40.

First, as shown in FIG. 5, the fourth semiconductor layer 88 at the uppermost layer may be patterned. More specifically, resist is coated on the fourth semiconductor layer 88, and the resist is patterned, thereby forming a resist layer R10 having a predetermined pattern. Then, by using the resist layer R10 as a mask, etching (for example dry-etching or wet-etching) is conducted to form a fifth semiconductor section 50.

Next, as shown in FIG. 6, the third semiconductor layers 84 and 86 are patterned. More specifically, a resist layer R20 is formed in a similar manner as described above, and etching is conducted by using the resist layer R20 as a mask. By patterning the third semiconductor layer 84, a third semiconductor section 26 that functions as a mirror, and a fourth semiconductor section 46 can be formed, and by patterning the third semiconductor layer 86, a third semiconductor section 28 that functions as a contact section and a fourth semiconductor section 48 can be formed.

As shown in FIG. 7, the second semiconductor layer 81 may also be patterned. More specifically, a resist layer R30 is formed in a similar manner as described above, and etching is conducted by using the resist layer R30 as a mask to thereby form a second semiconductor layer 82, and expose at least a portion of the first semiconductor layer 80. By this, a first electrode 30 can be formed in an exposed region of the first semiconductor layer 80.

It is noted that, without being limited to the order in the above-described patterning method, patterning may be conducted, for example, from the side near the substrate 10, i.e., the second semiconductor layer 81, the third semiconductor layers 84 and 86, and fourth semiconductor layer 88 may be patterned in this order.

Figure 8:
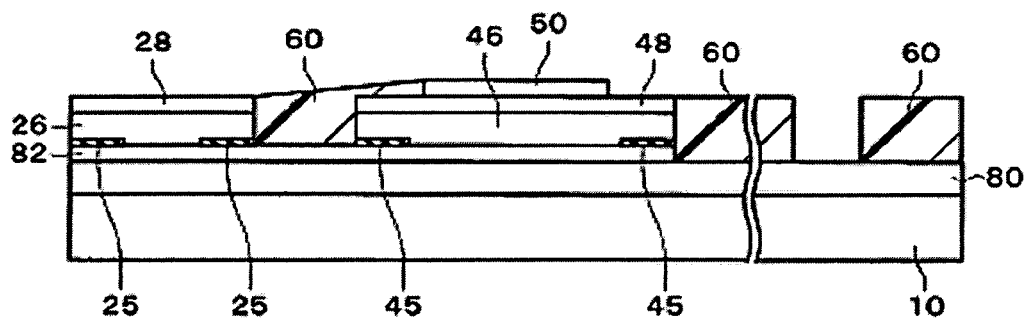
FIG. 8 is a view showing the method for manufacturing the surface-emitting type wafer in accordance with the first embodiment of the present invention.

Next, as shown in FIG. 8, by placing the semiconductor substrate 10 on which the light emitting element section 20 and the rectification element section 40 are supported in a water vapor atmosphere at about 400° C., for example, the layers having a high rate of Al composition (layers with Al composition being 0.95 or greater) in the third and fourth semiconductor sections 26 and 46 described above are oxidized from their side surfaces, thereby forming dielectric layers 25 and 45. The oxidation rate depends on the temperature of the furnace, the amount of water vapor supply, and the Al composition and the film thickness of the layer to be oxidized. In the surface-emitting type semiconductor laser that has the dielectric layer 25 in the light emitting section 20, an electric current flows, when it is driven, only in a portion where the dielectric layer 25 is not formed (i.e., a portion that has not been oxidized). Therefore, the current density can be controlled by controlling the forming region of the dielectric layer 25, in the process of forming the dielectric layer 25 by oxidation.

Then, a resin layer 60 is formed by patterning in a predetermined region of the substrate 10. The resin layer 60 can be formed by a known technique, such as, a dipping method, a spray coat method, a droplet ejection method (for example, an ink jet method), or the like. The resin layer 60 is formed while avoiding forming areas of first through fourth electrodes 30, 32, 34 and 36 to be described below. The resin layer 60 can be formed from, for example, polyimide resin, fluororesin, acrylic resin, or epoxy resin, and more particularly, it may preferably be formed from polyimide resin or fluororesin in view of their good workability and dielectric property.

Then, the first through fourth electrodes 30, 32, 34 and 36 are formed, and wirings 70, 72 and 74 for electrically connecting specified ones of the electrodes (see FIG. 1 and FIG. 2). The descriptions of the above-described surface-emitting type wafer can be applied to forming positions of the electrodes and the wirings, and details of their connection relations. Before the electrodes are formed, forming areas of these electrodes may be washed by using plasma processing if necessary. Also, as a method for forming electrodes, for example, at least one layer of conductive layer may be formed by a vacuum deposition method, and then, a part of the conductive layer may be removed by a lift-off method. It is noted that, instead of the lift-off method, a dry-etching method may be used. A method for forming the wirings may be similar to the method for forming the electrodes.

In this manner, a junction diode 52 is formed by the fourth and fifth semiconductor sections 48 and 50, and the junction diode 52 is connected in parallel between the first and second electrodes 30 and 32 in a direction that causes a rectification action in a reverse direction with respect to the light emitting element section 20. According to the process described above, after the process of growing the multiple semiconductor layers on the substrate 10 is completed, the semiconductor layers are patterned, such that the manufacturing process can be simplified, compared to a case, for example, where semiconductor layer growing steps and patterning steps are alternately repeated.

Then, a plurality of the surface-emitting type elements 1 are connected in series in a direction in which forward directions of their respective light emitting sections 20 coincide with one another, whereby a surface-emitting type wafer 1000 can be manufactured. All of the plurality of surface-emitting type elements 1 that are formed in one surface-emitting type wafer 1000 may be electrically connected, or a part of them may be electrically connected. In the example shown in FIG. 1, in adjacent ones of the surface-emitting type elements 1, the first electrode 30 of one of the surface-emitting type elements 1 and the fourth electrode 36 of the other of the surface-emitting type elements 1 are electrically connected by a wiring 76.

Effects of the method for manufacturing a surface-emitting type wafer in accordance with the present embodiment are the same as those described in conjunction with the surface-emitting type wafer. It is noted that the method for manufacturing a surface-emitting type wafer in accordance with the present embodiment includes details that can be derived from the explanation of the surface-emitting type wafer described above.

Second Embodiment

FIG. 9-FIG. 14 are views showing a surface-emitting type wafer in accordance with a second embodiment of the present invention, and a method for manufacturing the same. In the present embodiment, the structure of a rectification element section 140 in a surface-emitting type element 100 and its manufacturing method are different from the above. It is noted that the details explained in the first embodiment described above can be applied to a burn-in method of the surface-emitting type wafer.

2-1. Surface-Emitting Type Wafer

Figure 9:
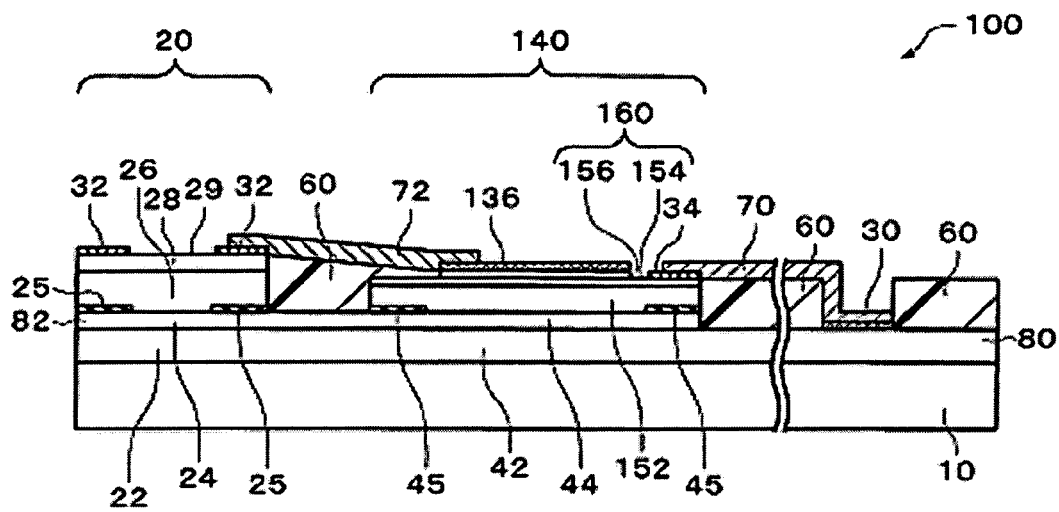
FIG. 9 is a cross-sectional view of a surface-emitting type wafer in accordance with a second embodiment of the present invention.

FIG. 9 is a cross-sectional view of a surface-emitting type wafer (including surface-emitting type elements 100) in accordance with present embodiment.

A rectification element section 140 in accordance with the present embodiment includes a Schottky diode 160. More specifically, the rectification element section 140 includes a first supporting section 42 composed of the same composition as that of the first semiconductor section 22, a second supporting section 44 composed of the same composition as that of the second semiconductor section 24, fourth semiconductor sections 152 and 154, and a fifth semiconductor section 156, which are arranged from the side of the substrate 10. A Schottky junction is formed in one of the fourth semiconductor sections 152 and 154 and the fifth semiconductor section 156, thereby composing a Schottky diode.

The fourth semiconductor sections 152 and 154 may be formed with the same composition as that of a part of the third semiconductor sections 26 and 28. In the example shown in FIG. 9, the fourth semiconductor sections 152 and 154 are formed with the same composition as that of a part of the third semiconductor section 26 that is a mirror. More specifically, when the third semiconductor section 26 includes at least two layers of different compositions (for example, at least two AlGaAs layers of different Al compositions), the fourth semiconductor section 154 at the uppermost surface is formed from one of the layers of the third semiconductor section 26 (for example, the layer having a lower Al composition).

The fifth semiconductor section 156 is also formed with the same composition as that of a part of the third semiconductor sections 26 and 28. In the example shown in FIG. 9, the fifth semiconductor section 156 is formed with the same composition as that of a part of the third semiconductor section 26 that is a mirror. More specifically, when the third semiconductor section 26 includes at least two layers of different compositions (for example, at least two AlGaAs layers of different Al compositions), the fifth semiconductor section 156 is formed from the other of the layers (for example, the layer having a higher Al composition).

Concretely, when the third semiconductor section 26 that is a mirror is formed from a predetermined number of pairs of alternately laminated p-type $Al_{0.9}Ga_{0.1}As$ layers and p-type $Al_{0.15}Ga_{0.85}As$ layers, the fourth semiconductor section 154 at the uppermost surface is formed from a p-type $Al_{0.15}Ga_{0.85}As$ layer, and the fifth semiconductor section 156 is formed from a p-type $Al_{0.9}Ga_{0.1}As$ layer. By this, the work function of the fifth semiconductor section 156 is higher than the work function of the fourth semiconductor section 154, such that a Schottky junction can be formed in the fifth semiconductor section 156. It is noted that the fourth semiconductor section 152 may be a remaining portion of the predetermined number of pairs of alternately laminated p-type $Al_{0.9}Ga_{0.1}As$ layers and p-type $Al_{0.15}Ga_{0.85}As$ layers. Also, the ratios of Al compositions are not limited to the above.

Also, when the fourth and fifth semiconductor sections 152 and 154, and 156 are formed with the same composition as that of a portion of the third semiconductor sections 26 and 28, the number of members reduces, the structure is simplified, and the cost of the device can be reduced.

Third and fourth electrodes 34 and 136 for driving are formed at the rectification element section 140.

The third electrodes 34 are electrically connected to the fourth semiconductor sections 152 and 154. For example, the fifth semiconductor section 156 may be formed on a part of the fourth semiconductor section 154, and the third electrode 34 may be formed in an exposed area of the fourth semiconductor section 154. In the example shown in FIG. 9, the third electrode 34 is electrically connected to the fourth semiconductor section 154 by ohmic contact. The third electrode 34 may be formed from a multilayer film of a Cr layer, an AuZn layer and an Au layer, which are arranged from the side of the fourth semiconductor section 154, or a multilayer film of a Pt layer, a Ti layer, a Pt layer and an Au layer.

On the other hand, the fourth electrode 136 is electrically connected to the fifth semiconductor section 156, and may be formed, for example, on an upper surface of the fifth semiconductor section 156. In the example shown in FIG. 9, the fourth electrode 136 is electrically connected to the fifth semiconductor section 156 by a Schottky junction. The fourth electrode 136 may be formed from a multilayer film of a Ti layer, a Pt layer and an Au layer, which are arranged from the side of the fifth semiconductor section 156, or may be formed from a multilayer film of a Ti layer and an Au layer, or may be formed from an Au layer, or may be formed from an AlAu layer, or may be formed from amorphous Si and P. It is noted that the details of the fourth electrode 36 described in the first embodiment can be applied to other details of the fourth electrode 136.

The fourth and fifth semiconductor sections 154 and 156 (Schottky diode 160) are connected in parallel between the first and second electrodes 30 and 32, and has a rectification action in a reverse direction with respect to the light emitting element section 20. In the present embodiment, like the first embodiment, the breakdown voltage value of the Schottky diode 160 may also preferably be greater than the drive voltage of the light emitting element section 20. Further, electrical connections among the respective electrodes are made in the same manner as described in the first embodiment.

It is noted that other details of the surface-emitting type wafer in accordance with the present embodiment include details that can be derived from the explanation of the surface-emitting type wafer in accordance with the first embodiment described above.

2-2. Method of Manufacturing Surface-Emitting Type Wafer

FIGS. 10-14 are figures showing a method for manufacturing a surface-emitting type wafer in accordance with the present embodiment.

Figure 10:
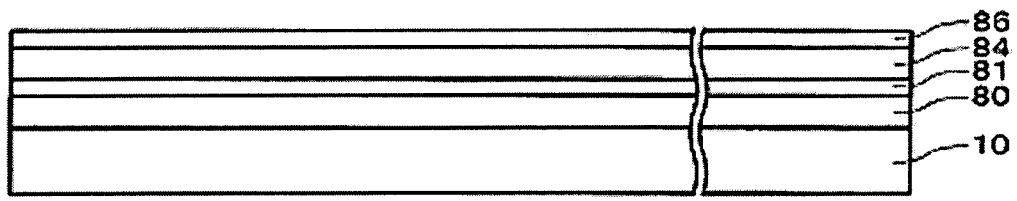
FIG. 10 is a view showing a method for manufacturing the surface-emitting type wafer in accordance with the second embodiment of the present invention.

As shown in FIG. 10, on a substrate 10, a first semiconductor layer 80 of a first conductivity type (for example, n-type), a second semiconductor layer 81 that functions as an active layer, and third semiconductor layers 84 and 86 of a second conductivity type (for example, p-type), are formed by epitaxial growth while varying the composition. The first embodiment may be referred to for details of the compositions of these layers.

Next, as shown in FIG. 11-FIG. 14, at least the third semiconductor layers 84 and 88 are patterned to form a light emitting element section 20 and a rectification element section 140.

Figure 11:
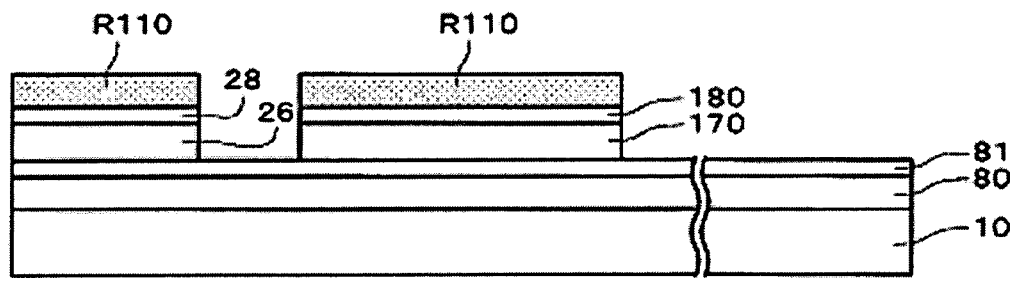
FIG. 11 is a view showing the method for manufacturing the surface-emitting type wafer in accordance with the second embodiment of the present invention.
Figure 12:
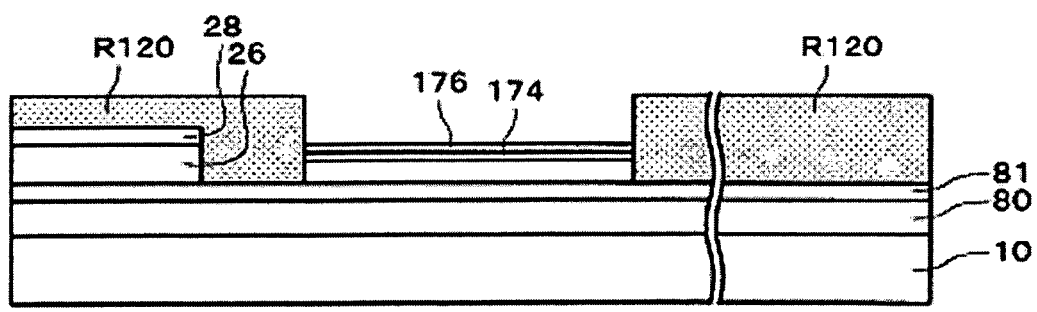
FIG. 12 is a view showing the method for manufacturing the surface-emitting type wafer in accordance with the second embodiment of the present invention.
Figure 13:
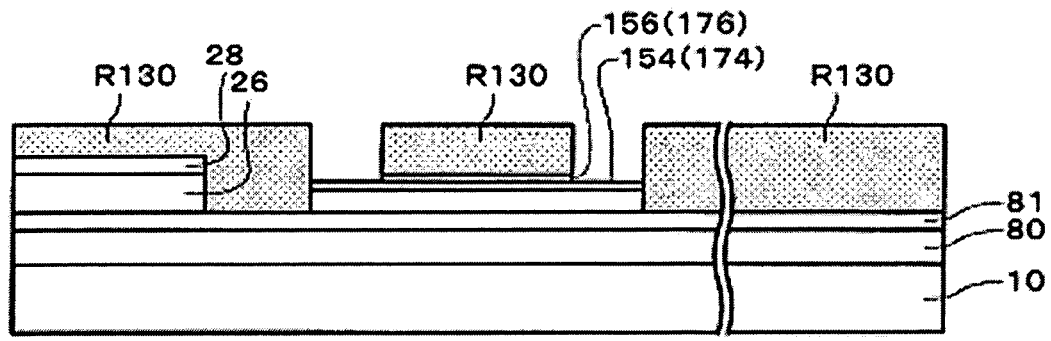
FIG. 13 is a view showing the method for manufacturing the surface-emitting type wafer in accordance with the second embodiment of the present invention.

First, as shown in FIG. 11-FIG. 13, the third semiconductor layers 84 and 86 are patterned.

As shown in FIG. 11, a resist layer R110 is formed on the third semiconductor layers 84 and 86. The resist layer R110 is formed in areas for the light emitting element section 20 and the rectification element section 140, respectively. Then, by using the resist layer R110 as a mask, the third semiconductor layers 84 and 86 are etched (for example, by dry-etching or wet-etching). In this manner, third semiconductor sections 26 and 28 are formed in the area of the light emitting element section 20, and third semiconductor layers 170 and 180 are formed in the area of the rectification element section 140. The third semiconductor layer 170 is formed with the same composition as that of the third semiconductor section 26 that is a mirror, and the third semiconductor layer 180 is formed with the same composition as that of the third semiconductor section 28 that is a contact section.

Next, as shown in FIG. 12, a resist layer R120 is formed in a region excluding over the third semiconductor layers 170 and 180, and then the third semiconductor layer 180 is entirely removed by etching. The third semiconductor layer 170 includes at least two layers 174 and 176 of different compositions, and a part of the third semiconductor layer 170 is further removed by etching, to thereby expose one of the layers (the layer 176 in FIG. 12). When the third semiconductor section 26 is a mirror, the third semiconductor layer 170 may be formed from, for example, at least two layers of AlGaAs layers of different Al compositions (for example, layers composed of a predetermined number of pairs of alternately laminated p-type $Al_{0.9}Ga_{0.1}As$ layers and p-type $Al_{0.15}Ga_{0.85}As$ layers), and the layer 176 to be exposed may be, for example, the layer with a higher Al composition (concretely, the p-type $Al_{0.9}Ga_{0.1}As$ layer). In the example described in the present embodiment, the layer 176 becomes a fifth semiconductor section 156, and the layer 174 becomes a fourth semiconductor section 154 (see FIG. 13).

Then, as shown in FIG. 13, a resist layer R130 is formed in areas other than the etching region, and a part of the layer 176 is etched and removed by using the resist layer R130 as a mask, to thereby expose the layer 174 (for example, the layer with a lower Al composition (concretely, the p-type $Al_{0.15}Ga_{0.85}As$ layer)). By so doing, a third electrode 34 can be formed on the fourth semiconductor section 154 (layer 174).

Figure 14:
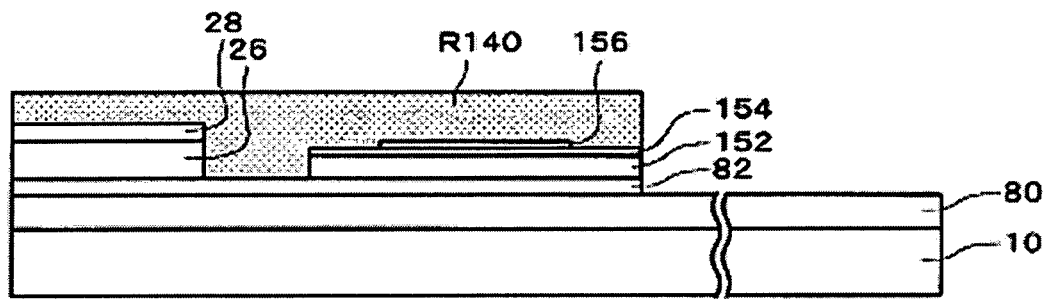
FIG. 14 is a view showing the method for manufacturing the surface-emitting type wafer in accordance with the second embodiment of the present invention.

Then, as described in the first embodiment, the second semiconductor layer 81 may also be patterned, as shown in FIG. 14. More specifically, a resist layer R140 is formed, and etching is conducted by using the resist layer R140 as a mask, to form a second semiconductor layer 82 and expose at least a part of the first semiconductor layer 80.

It is noted that, without being limited to the order in the above-described patterning method, patterning may be conducted, for example, from the side near the substrate 10, i.e., the second semiconductor layer 81 may be patterned, and then the third semiconductor layers 84 and 86 may be patterned, Then, as described in the first embodiment, dielectric layers 25 and 45 are formed, and a resist layer 60 is formed. Also, first and second electrodes 30 and 32 for driving the light emitting element section 20 are formed, third and fourth electrodes 34 and 136 for driving the rectification element section 140 are formed, and wirings 70 and 72 for electrically connecting specified ones of the electrodes are formed (see FIG. 9). Details thereof are the same as described in the first embodiment. However, in the present embodiment, in the process of forming electrodes, a Schottky junction is formed in one of the fourth semiconductor sections 152 and 154 and the fifth semiconductor section 156. The fourth electrode 136 may be formed in a manner to form a Schottky junction in the fifth semiconductor section 156, and the third electrode 34 may be formed in a manner to form an ohmic contact in the fourth semiconductor section 154.

In this manner, a Schottky diode 160 is formed with the fourth and fifth semiconductor sections 154 and 156, and the Schottky diode 160 is connected in parallel between the first and second electrodes 30 and 32 in a direction so as to have a rectification action in a reverse direction with respect to the light emitting element section 20. According to the process described above, compared to the first embodiment, the number of semiconductor layers to be grown on the substrate 10 is fewer, and the step of removing the semiconductor layers on the light emitting element section 20 is not necessary, such that the manufacturing process can be facilitated.

It is noted that other details of the method for manufacturing a surface-emitting type wafer in accordance with the present embodiment include details that can be derived from the explanation of the method for manufacturing a surface-emitting type wafer in accordance with the first embodiment.

Third Embodiment

Figure 15:
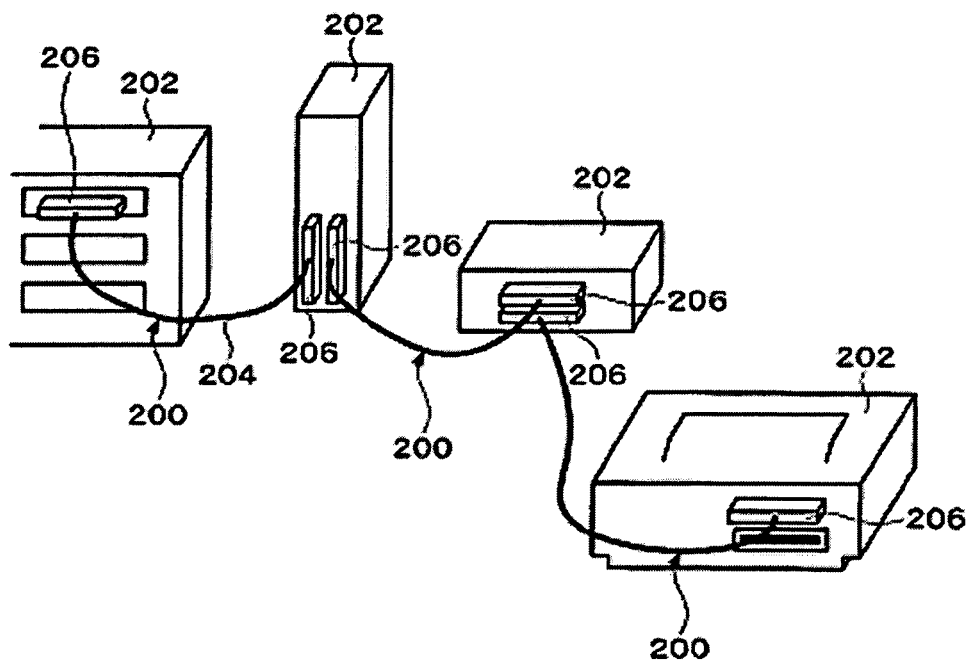
FIG. 15 is a diagram showing optical transmission devices in accordance with a third embodiment of the present invention.

FIG. 15 is a diagram showing optical transmission devices in accordance with a third embodiment of the present invention. The optical transmission devices 200 mutually connect electronic devices 202, such as, a computer, a display device, a storage device, a printer and the like. The electronic devices 202 may be information communication devices. The optical transmission device 200 may be provided with a cable 204 and plugs 206 provided on both ends thereof. The cable 204 includes an optical fiber. The plug 206 includes on its inside an optical device (including the surface-emitting type device described above). The plug 206 may further include on its inside a semiconductor chip.

An optical element connected to one of the end sections of the optical fiber is a light emitting element (the surface-emitting type element described above), and an optical element connected to the other end of the optical fiber is a light-receiving element. Electrical signals outputted from the electronic device 202 on one end are converted to optical signals by the light emitting element. The optical signals are transmitted through the optical fiber and inputted in the light-receiving element. The light-receiving element converts the inputted optical signals to electrical signals. Then, the electrical signals are inputted in the electronic device 202 on the other end. In this manner, by the optical transmission device 200 of the present embodiment, information can be transmitted among the electronic devices 202 by optical signals.

Fourth Embodiment

Figure 16:
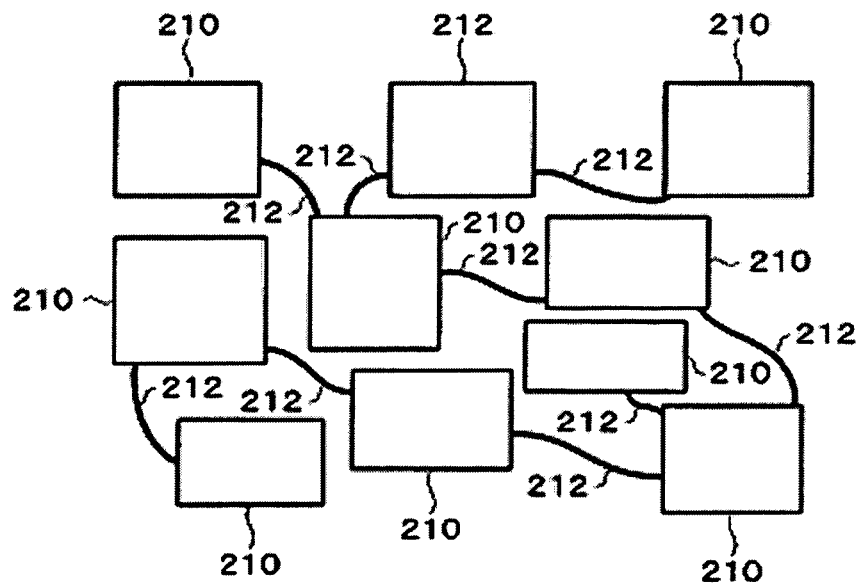
FIG. 16 is a diagram showing a usage configuration of optical transmission devices in accordance with a fourth embodiment of the present invention.

FIG. 16 is a diagram showing a usage configuration of optical transmission devices in accordance with a fourth embodiment of the present invention. Optical transmission devices 212 connect electronic devices 210. The electronic devices 210 include, for example, liquid crystal display monitors, digital CRTs (which may be used in the fields of finance, mail order, medical treatment, and education), liquid crystal projectors, plasma display panels (PDP), digital TVs, cash registers of retail stores (for POS (Point of Sale) scanning), videos, tuners, gaming devices, printers and the like.

Fifth Embodiment

FIG. 17-FIG. 21 are views showing a surface-emitting type wafer in accordance with a fifth embodiment of the present invention, and a method for manufacturing the same. In the present embodiment, the structure of a rectification element section 240 in a surface-emitting type element 220 and its manufacturing method are different from the first embodiment. It is noted that the details explained in the first embodiment described above can be applied to a burn-in method of the surface-emitting type wafer.

5-1. Surface-emitting Type Device

Figure 17:
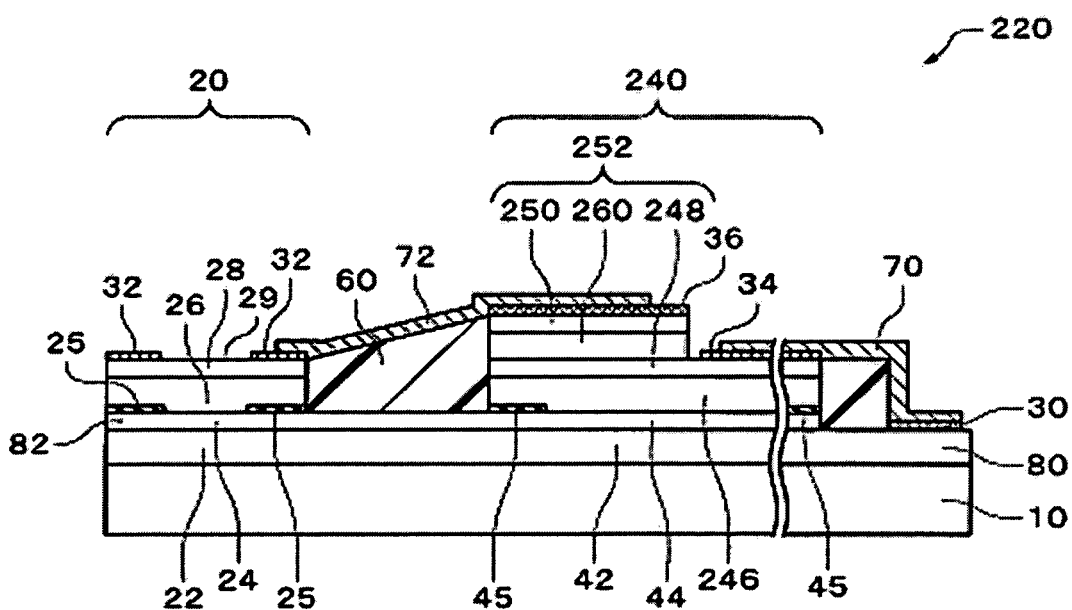
FIG. 17 is a cross-sectional view of a surface-emitting type wafer in accordance with a fifth embodiment of the present invention.

FIG. 17 is a cross-sectional view of a surface-emitting type wafer (including surface-emitting type elements 220) in accordance with the present embodiment. The surface-emitting type device 220 includes a light emitting element section 20, and a rectification element section 240. Details of the light emitting element 20 are the same as described in the first embodiment.

The rectification element section 240 includes a junction diode 252. More specifically, the rectification element section 240 includes a first supporting section 42 composed of the same composition as that of a first semiconductor section 22, a second supporting section 44 composed of the same composition as that of a second semiconductor section 24, fourth semiconductor sections 246 and 248, a capacitance reducing section 260, and a fifth semiconductor section 250, which are arranged from the side of the substrate 10. The first and second supporting sections 42 and 44 are the same as described in the first embodiment.

The fourth semiconductor sections 246 and 248 are formed in a second conductivity type (for example, p-type), and the fifth semiconductor section 250 is formed in a first conductivity type (for example, n-type). By this, a pn junction diode can be formed by the fourth and fifth semiconductor sections 248 and 250, and the capacitance reducing section 260 provided between them. It is noted that not only the fourth semiconductor section 248 but also the fourth semiconductor section 246 may contribute to operations of the pn junction diode.

The fourth semiconductor sections 246 and 248 may be formed with the same composition as that of third semiconductor sections 26 and 28. In the example shown in FIG. 17, the fourth semiconductor section 246 is formed with the same composition as that of the third semiconductor section 26 that is a mirror, and the fourth semiconductor section 248 is formed with the same composition as that of the third semiconductor section 28 that is a contact section. The fourth semiconductor section 248 at the uppermost surface may be formed with a (for example, p-type) GaAs layer.

In the present embodiment, the fifth semiconductor section 250 is not limited in its material as long as it has a conductivity type different from that of the fourth semiconductor sections 246 and 248. For example, the fifth semiconductor section 250 may be formed in a conductivity type different from that of the fourth semiconductor sections 246 and 248, and with the same composition ((for example, n-type) GaAs layer) as that of at least a part of the fourth semiconductor sections 246 and 248 (for example, the fourth semiconductor section 248).

In the present embodiment, the capacitance reducing section 260 is provided between the fourth and fifth semiconductor sections 248 and 250. By this, in operating the surface-emitting type element 220 after having been cut into individual pieces, the capacitance of the junction diode 252 can be reduced, such that hindrance of high-speed driving of the light emitting element section 20 by the junction diode 252 can be prevented. In particular, in accordance with the present embodiment, because the rectification element section 240 is connected in parallel with respect to the light emitting element section 20, the capacitances of the light emitting element section 20 and the rectification element section 240 influence as an added value. For this reason, the reduction of the capacitance of the junction diode 252 is very effective in driving the surface-emitting type element 220 at higher speeds.

The capacitance reducing section 260 may be provided on a region of a portion of the fourth semiconductor section 248 in order to secure an electrical connection region. The material, thickness and area of the capacitance reducing section 260 can be decided based on the capacitance value of the junction diode 252. To reduce the capacitance of the junction diode 252, a material having a low relative dielectric constant may preferably be used for the capacitance reducing section 260.

The capacitance reducing section 260 may be a semiconductor section (sixth semiconductor section). When the capacitance reducing section 260 is formed from an intrinsic semiconductor, the junction diode 252 can be called a pin diode. It is noted that an intrinsic semiconductor is a semiconductor in which most of the carriers that contribute to electrical conduction are free electrons thermally excited in a conductor from the valence band, or holes in the same number generated in the valence band, and changes in the carrier density due to the presence of impurities and/or lattice defects can be ignored.

Alternatively, the capacitance reducing section 260 may be a semiconductor section of the same conductivity type as that of the fourth semiconductor section 248 (for example, p-type), and has an impurity concentration to be doped lower than that of the fourth semiconductor section 248 (for example, an impurity concentration lower by one digit or more). Alternatively, the capacitance reducing section 260 may be a semiconductor section of the same conductivity type as that of the fifth semiconductor section 250 (for example, n-type), and has an impurity concentration to be doped lower than that of the fifth semiconductor section 250 (for example, an impurity concentration lower by one digit or more).

It is noted that, to reduce the capacitance of the junction diode 252, the thickness of the capacitance reducing section 260 may preferably be made greater, and the area thereof may preferably be made smaller. For example, the capacitance reducing section 260 may have a thickness greater than that of the fourth semiconductor section 248 (or the fifth semiconductor section 250), and an area smaller than that of the fourth semiconductor section 248.

The capacitance reducing section 260 may be formed from, for example, an AlGaAs layer, a GaAs layer or the like. If the capacitance reducing section 260 is formed from a material different from that of the fourth semiconductor section 248 that serves as a ground, a selection ratio in etching can be obtained, such that selective etching of the capacitance reducing section 260 is easy. For example, when the fourth semiconductor section 248 is formed from a GaAs layer, the capacitance reducing section 260 may be formed from an AlGaAs layer.

When the capacitance reducing section 260 is formed from an AlGaAs layer, the ratio of each composition is not particularly limited, but a higher Al composition ratio may be preferred because the relative dielectric constant of the capacitance reducing section 260 can be lowered. The ratio of each composition of an AlGaAs layer of the capacitance reducing section 260 may be defined by, for example, $Al_xGa_{1-x}As$ ($x \square 0.5$). By this, because the Al composition ratio is high, the capacitance of the junction diode 252 can be further reduced, and a sufficient etching selection ratio can be obtained with respect to the aforementioned fourth semiconductor section 248 that serves as a ground.

It is noted that other details of the surface-emitting type wafer in accordance with the present embodiment include details that can be derived from the explanation of the method for manufacturing a surface-emitting type wafer in accordance with the first embodiment.

5-2. Method of Manufacturing Surface-Emitting Type Device

FIGS. 18-21 are figures showing a method for manufacturing a surface-emitting type device in accordance with the fifth embodiment of the present invention.

Figure 18:
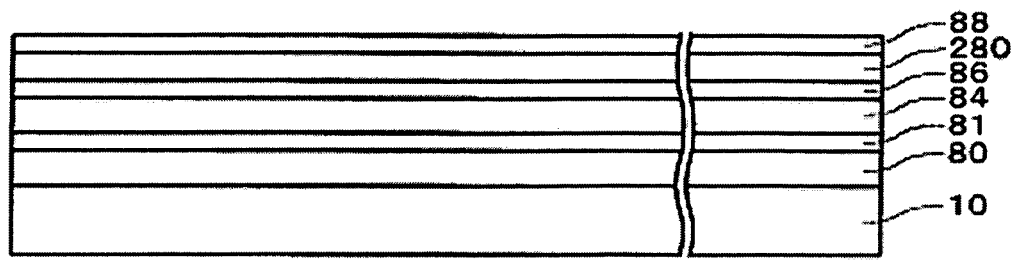
FIG. 18 is a view showing a method for manufacturing the surface-emitting type device in accordance with the fifth embodiment of the present invention.

As shown in FIG. 18, on a substrate 10, a first semiconductor layer 80 of a first conductivity type (for example, n-type), a second semiconductor layer 81 that functions as an active layer, and third semiconductor layers 84 and 86 of a second conductivity type (for example, p-type), a capacitance reducing layer 280, and a fourth semiconductor layer 88 of the first conductivity type (for example, n-type) are formed by epitaxial growth while varying the composition. The composition of the capacitance reducing layer 280 corresponds to the details of the capacitance reducing section 260 described above. Details of other layers correspond to the details already described.

Figure 19:
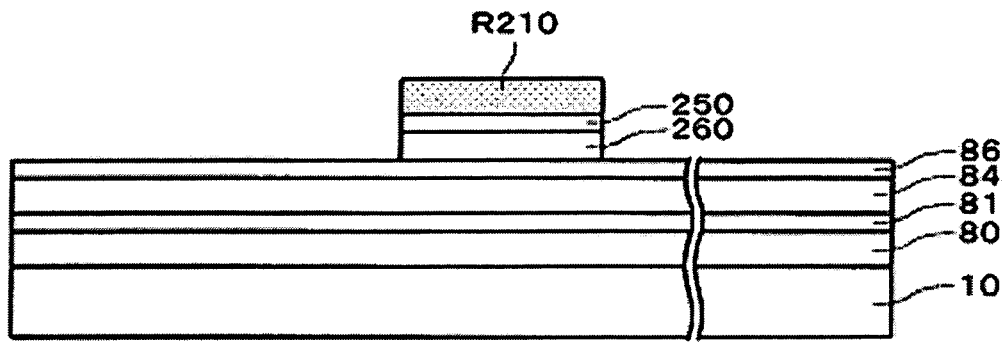
FIG. 19 is a view showing the method for manufacturing the surface-emitting type device in accordance with the fifth embodiment of the present invention.
Figure 20:
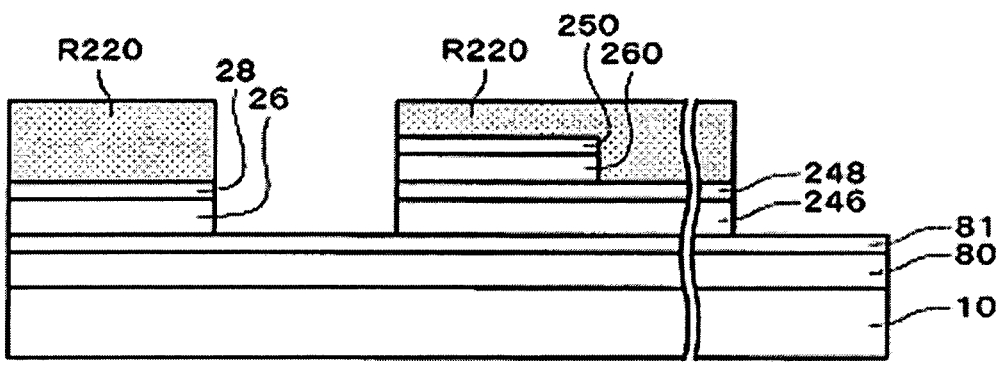
FIG. 20 is a view showing the method for manufacturing the surface-emitting type device in accordance with the fifth embodiment of the present invention.
Figure 21:
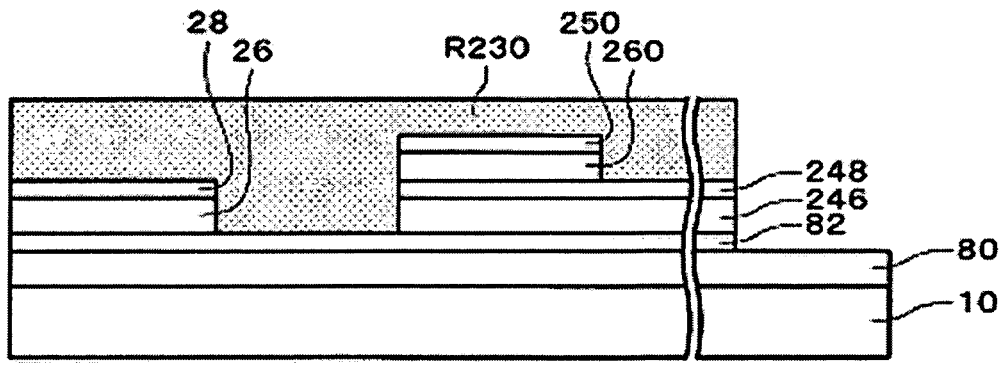
FIG. 21 is a view showing the method for manufacturing the surface-emitting type device in accordance with the fifth embodiment of the present invention.

Next, as shown in FIG. 19-FIG. 21, at least the third semiconductor layers 84 and 86, the capacitance reducing layer 280 and the fourth semiconductor layer 88 are patterned, to thereby form a light emitting element section 20 and a rectification element section 240.

First, as shown in FIG. 19, the fourth semiconductor layer 88 at the uppermost layer, and a layer therebelow, i.e., the capacitance reducing layer 280 may be patterned. More specifically, resist is coated on the fourth semiconductor layer 88, and the resist is patterned, thereby forming a resist layer R210 having a predetermined pattern. Then, by using the resist layer R210 as a mask, etching (for example, dry-etching or wet-etching) is conducted. By conducting wet-etching, a surface (the third semiconductor layer 86 including a light emission surface 29) that is newly exposed after etching can be made into a smooth surface. Also, if the capacitance reducing layer 280 is formed from a material different from that of the third semiconductor layer 86 (the layer including the uppermost surface) that serves as a ground, a selection ratio in etching can be obtained, such that selective etching of the capacitance reducing layer 280 is easy. For example, when the third semiconductor layer 86 is formed from a GaAs layer, the capacitance reducing layer 280 may be formed from an AlGaAs layer. The ratio of each composition of an AlGaAs layer of the capacitance reducing layer 280 may be defined by, for example, $Al_xGa_{1-x}As$ (x□0.5). By this, a sufficient etching selection ratio can be obtained with respect to the aforementioned third semiconductor layer 86 that serves as a ground. Accordingly, better patterning can be performed.

In this manner, after the fifth semiconductor section 250 and the capacitance reducing section 260 are formed, the third semiconductor layers 84 and 86 are patterned, as shown in FIG. 20. More specifically, a resist layer R220 is formed in a similar manner as described above, and etching is conducted by using the resist layer R220 as a mask. By patterning the third semiconductor layer 84, a third semiconductor section 26 that functions as a mirror and a fourth semiconductor section 246 can be formed, and by patterning the third semiconductor layer 86, a third semiconductor section 28 that functions as a contact section and a fourth semiconductor section 248 can be formed.

As shown in FIG. 21, the second semiconductor layer 81 may also be patterned. More specifically, a resist layer R230 is formed in a similar manner as described above, etching is conducted by using the resist layer R230 as a mask, to thereby form a second semiconductor layer 82 and expose at least a portion of the first semiconductor layer 80. By this, a first electrode 230 can be formed in an exposed region of the first semiconductor layer 80.

It is noted that, without being limited to the order in the patterning method described above, patterning can be conducted from, for example, the side closer to the substrate 10, i.e., the second semiconductor layer 81, the third semiconductor layers 84 and 86, the capacitance reducing layer 280 and the semiconductor layer 88 can be patterned in this order.

Then, as described in the first embodiment, dielectric layers 25 and 45 are formed, and a resin layer 60 is formed. Further, first and second electrodes 30 and 32 for driving the light emitting element section 20 are formed, third and fourth electrodes 34 and 36 for driving the rectification element section 240 are formed, and wirings 70 and 72 for electrically connecting specified ones of the electrodes to one another are formed (see FIG. 17).

It is noted that other details of the method for manufacturing a surface-emitting type device in accordance with the present embodiment include details that can be derived from the explanation of the method for manufacturing a surface-emitting type device in accordance with the first embodiment.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that can achieve the same functions and effects or achieve the same objects of those of the compositions described in the embodiments. Furthermore, the present invention includes compositions that include publicly known technology added to the compositions described in the embodiments.

What is claimed is:

1. A surface-emitting type wafer comprising a substrate and a plurality of surface-emitting type elements formed above the substrate, wherein each of the surface-emitting type elements includes a light emitting element section, first and second electrodes for driving the light emitting element section, and a rectification element section, the rectification element section is connected in parallel between the first and second electrodes, and has a rectification action in a reverse direction with respect to the light emitting element section, the plurality of surface-emitting type elements are connected in series in a direction in which forward directions of the respective light emitting element sections coincide with one another, the light emitting element section includes, above the substrate, a first semiconductor section of a first conductivity type, a second semiconductor section that functions as an active layer, and a third semiconductor section of a second conductivity type, which are arranged from a side of the substrate, and the rectification element section includes, above the substrate, a first supporting section consisting of an identical composition of the first semiconductor section, a second supporting section consisting of an identical composition of the second semiconductor section, a fourth semiconductor section, and a fifth semiconductor section, which are arranged from the side of the substrate.

2. A surface-emitting type wafer according to claim 1, wherein the fourth semiconductor section is formed of the second conductivity type, and the fifth semiconductor section is formed of the first conductivity type.

3. A surface-emitting type wafer according to claim 2, wherein the fourth semiconductor section is formed with a composition identical with the third semiconductor section.

4. A surface-emitting type wafer according to claim 1, wherein a capacitance reducing section is provided between the fourth and fifth semiconductor sections.

5. A surface-emitting type wafer according to claim 4, wherein the capacitance reducing section is composed of an intrinsic semiconductor.

6. A surface-emitting type wafer according to claim 4, wherein the capacitance reducing section is composed of a semiconductor having an impurity concentration lower than the fourth or fifth semiconductor sections.

7. A surface-emitting type wafer according to claim 4, wherein the fourth semiconductor section includes a GaAs layer at an uppermost surface, and the capacitance reducing section includes an AlGaAs layer.

8. A surface-emitting type wafer according to claim 1, wherein one of the fourth and fifth semiconductor sections is formed with a Schottky junction.

9. A surface-emitting type wafer according to claim 8, wherein
   the third semiconductor section includes at least two layers of different compositions,
   the fourth semiconductor section includes a composition identical with at least one of the two layers of different compositions, and
   the fifth semiconductor section includes a composition identical with at least the other of the two layers of different compositions.

10. A surface-emitting type wafer according to claim 1, wherein
    the light emitting element section functions as a surface-emitting type semiconductor laser,
    the first semiconductor section functions as a first mirror, and
    the third semiconductor section functions as a second mirror.

11. A surface-emitting type wafer according to claim 10, wherein
    the third semiconductor section includes at least two layers of AlGaAs layers of different Al compositions,
    the fifth semiconductor section includes an AlGaAs layer with an Al composition higher than the fourth semiconductor section, and
    a Schottky junction is formed in the fifth semiconductor section.

12. A burn-in method using the surface-emitting type wafer recited in claim 1, burn-in method for the surface-emitting type wafer comprising the step of:
    circulating a current of a predetermined current value to the plurality of surface-emitting type elements connected in series in a forward direction of the light emitting element sections,
    wherein the predetermined current value is greater than a current value corresponding to a breakdown voltage of the rectification element section.

* * * * *